United States Patent
Cader et al.

(10) Patent No.: US 7,477,513 B1
(45) Date of Patent: Jan. 13, 2009

(54) DUAL SIDED BOARD THERMAL MANAGEMENT SYSTEM

(75) Inventors: Tahir Cader, Liberty Lake, WA (US); Paul A. Knight, Spokane, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 62 days.

(21) Appl. No.: 11/618,566

(22) Filed: Dec. 29, 2006

(51) Int. Cl.
*H05K 7/20* (2006.01)
*H01L 23/36* (2006.01)

(52) U.S. Cl. ............... 361/699; 361/700; 165/80.4; 257/714; 62/259.2

(58) Field of Classification Search ......... 361/687–689, 361/698–703, 717–719, 784, 785, 791, 796, 361/752; 165/80.3, 80.5, 104.33, 908; 257/712–715; 62/259.2; 174/15.1, 16.1, 16.3, 252
See application file for complete search history.

(56) References Cited

U.S. PATENT DOCUMENTS

| | | | | |
|---|---|---|---|---|
| 4,407,136 A | * | 10/1983 | de Kanter | 62/64 |
| 4,498,118 A | * | 2/1985 | Bell | 361/694 |
| 4,912,600 A | * | 3/1990 | Jaeger et al. | 361/700 |
| 5,220,804 A | | 6/1993 | Tilton et al. | |
| 5,270,572 A | * | 12/1993 | Nakajima et al. | 257/714 |
| 5,349,831 A | * | 9/1994 | Daikoku et al. | 62/376 |
| 5,687,577 A | * | 11/1997 | Ballard et al. | 62/64 |
| 5,718,117 A | * | 2/1998 | McDunn et al. | 62/64 |
| 5,719,444 A | | 2/1998 | Tilton et al. | |
| 5,831,824 A | * | 11/1998 | McDunn et al. | 361/699 |
| 5,880,931 A | | 3/1999 | Tilton et al. | |
| 5,889,651 A | * | 3/1999 | Sasaki et al. | 361/699 |
| 6,447,270 B1 | | 9/2002 | Schmidt et al. | |
| 6,955,062 B2 | | 10/2005 | Tilton et al. | |
| 7,009,842 B2 | | 3/2006 | Tilton et al. | |
| 7,064,953 B2 | | 6/2006 | Miller | |
| 7,104,078 B2 | | 9/2006 | Tilton | |
| 7,150,109 B2 | | 12/2006 | Knight et al. | |
| 7,159,414 B2 | | 1/2007 | Tilton et al. | |
| 7,180,741 B1 | | 2/2007 | Knight et al. | |
| 7,299,647 B2 | | 11/2007 | Tilton et al. | |
| 7,301,772 B2 | | 11/2007 | Tilton et al. | |
| 7,392,660 B2 | | 7/2008 | Tilton et al. | |
| 7,397,154 B2 | | 7/2008 | Tilton et al. | |
| 7,404,261 B1 | | 7/2008 | Knight et al. | |
| 7,405,935 B1 | | 7/2008 | Carey | |
| 7,428,152 B1 | | 9/2008 | Tilton | |
| 2005/0254214 A1 | | 11/2005 | Salmon | |
| 2007/0183125 A1 | * | 8/2007 | Tilton et al. | 361/699 |

OTHER PUBLICATIONS

Culhane, Marquise—An Embedded High Performance Computer Demonstration, 14 pgs.

* cited by examiner

*Primary Examiner*—Michael V Datskovskiy
(74) *Attorney, Agent, or Firm*—Michael S. Neustel

(57) ABSTRACT

A dual sided board thermal management system for efficiently thermally managing a printed circuit board having electronic components on opposing sides thereof. The dual sided board thermal management system generally includes a housing surrounding a portion of a printed circuit board, and a plurality of coolant dispensing units within the housing directed towards opposite sides of the printed circuit board to thermally manage electronic components on opposite sides of the printed circuit board.

24 Claims, 5 Drawing Sheets

DUAL SIDED BOARD THERMAL MANAGEMENT SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to liquid thermal management devices and more specifically it relates to a dual sided board thermal management system for efficiently thermally managing a printed circuit board having electronic components on opposing sides thereof.

2. Description of the Related Art

Any discussion of the prior art throughout the specification should in no way be considered as an admission that such prior art is widely known or forms part of common general knowledge in the field.

Modern electronic devices (e.g. integrated circuits, microprocessors, circuit boards and power supplies) and other heat producing devices have significant thermal management requirements. Conventional dry thermal management technology (e.g. forced air convection using fans and heat sinks) simply is not capable of efficiently thermally managing modern electronics.

Single-phase liquid thermal management systems (e.g. liquid cold plates) and two-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices.

Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology, as it relates to cooling electronics. U.S. Pat. No. 6,108,201 entitled Fluid Control Apparatus and Method for Spray Cooling to Tilton et al. also describes the usage of spray technology to cool a printed circuit board.

The liquid coolant typically used within a spray cooling system is a dielectric fluid (e.g. perfluorocarbons and hydrofluoroethers) having a low vaporization temperature at standard atmospheric pressure. One common brand of dielectric liquid coolant for two-phase thermal management systems is a perfluorocarbon manufactured by Minnesota Mining and Manufacturing Company (3M®) under the federally registered trademark FLUORINERT®.

BRIEF SUMMARY OF THE INVENTION

The general purpose of the present invention is to provide a dual sided board thermal management system that has many of the advantages of the liquid thermal management systems mentioned heretofore. The invention generally relates to a thermal management system which includes a housing surrounding a portion of a printed circuit board, and a plurality of spray units within the housing directed towards opposite sides of the printed circuit board to thermally manage electronic components on opposite sides of the printed circuit board.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a dual sided board thermal management system for efficiently thermally managing a printed circuit board having electronic components on opposing sides thereof.

Another object is to provide a dual sided board thermal management system that may be utilized to thermally manage various types of printed circuit boards such as but not limited to expansion boards, dual in-line memory modules (DIMM), controller boards, network interface cards, video adapters, motherboards and daughter cards.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
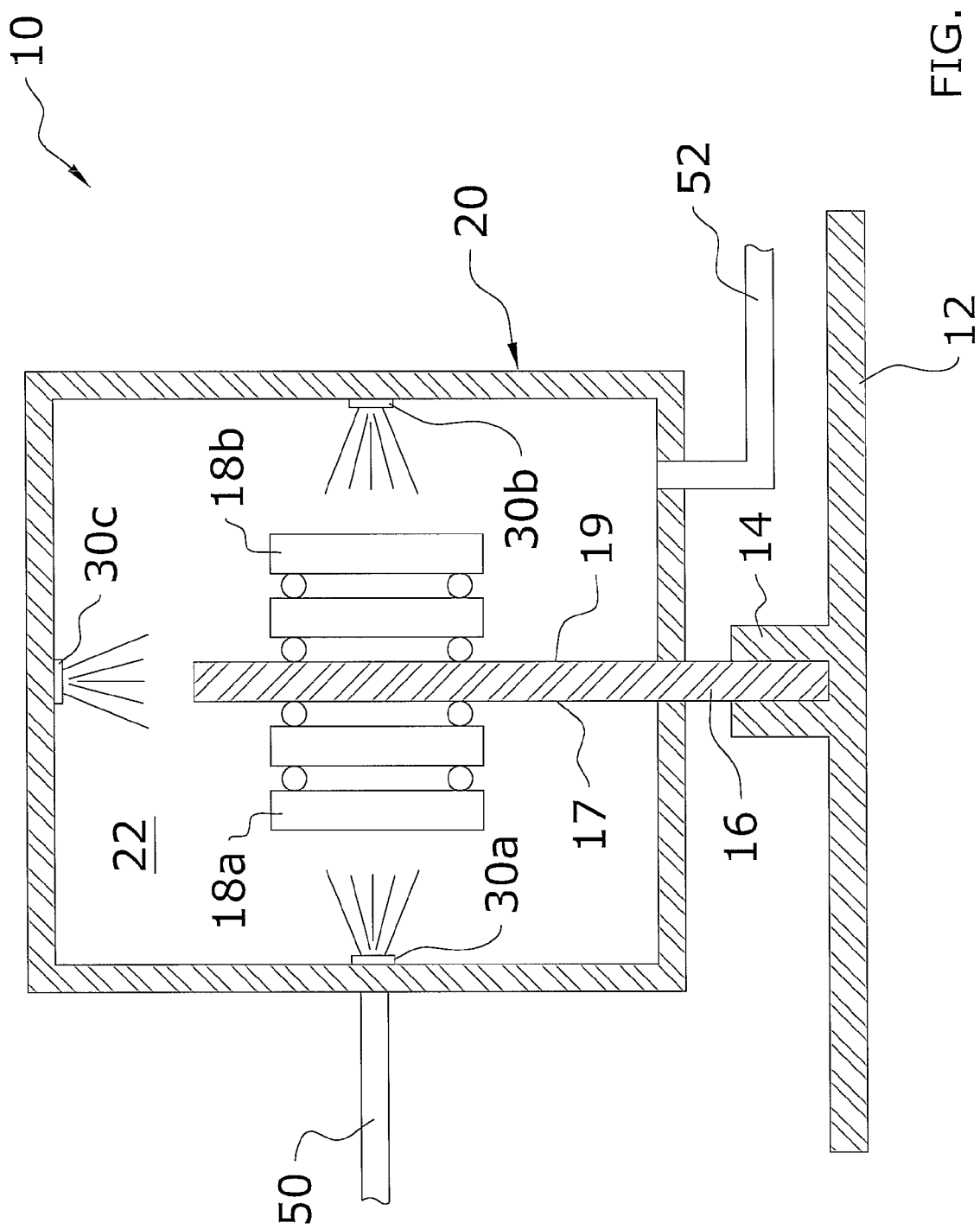
FIG. 1 is a side cutaway view of a first embodiment of the present invention.

Turning now descriptively to the drawings, in which similar reference characters denote similar elements throughout the several views, FIGS. 1 through 5 illustrate a dual sided board thermal management system 10, which comprises a housing 20 surrounding a portion of a printed circuit board 16, and a plurality of spray units 30a, 30b, 30c within the housing 20 directed towards opposite sides of the printed circuit board 16 to thermally manage electronic components 18a, 18b on opposite sides of the printed circuit board 16.

B. Printed Circuit Board

FIGS. 1 through 4 illustrate a printed circuit board 16 suitable for use in the present invention. The printed circuit board 16 may be comprised of various types of circuit boards such as but not limited to expansion boards, dual in-line memory modules (DIMM), controller boards, network interface cards, video adapters, motherboards and daughter cards.

The first side 17 of the printed circuit board 16 includes at least one first electronic component 18a and the second side 19 includes at least one second electronic component 18b. The first electronic component 18a and the second electronic component 18b are on opposite sides of the printed circuit board 16 as shown in FIGS. 1 through 4 of the drawings.

The electronic components 18a, 18b may be comprised of various devices such as but not limited to integrated circuits, microprocessors, memory and power supplies. The electronic components 18a, 18b may include stacked CSP (chip-size package) in which multiple integrated circuits are stacked upon one another as illustrated in FIGS. 1 through 4 of the drawings.

The printed circuit board 16 has a first side 17 and a second side 19 as illustrated in FIGS. 1 through 4 of the drawings. The first side 17 and the second side 19 of the printed circuit board 16 are on opposite sides of the printed circuit board 16 as illustrated in FIGS. 1 through 4 of the drawings. In addition, the first side 17 and the second side 19 of the printed circuit board 16 are typically substantially parallel to one another.

Figure 2:
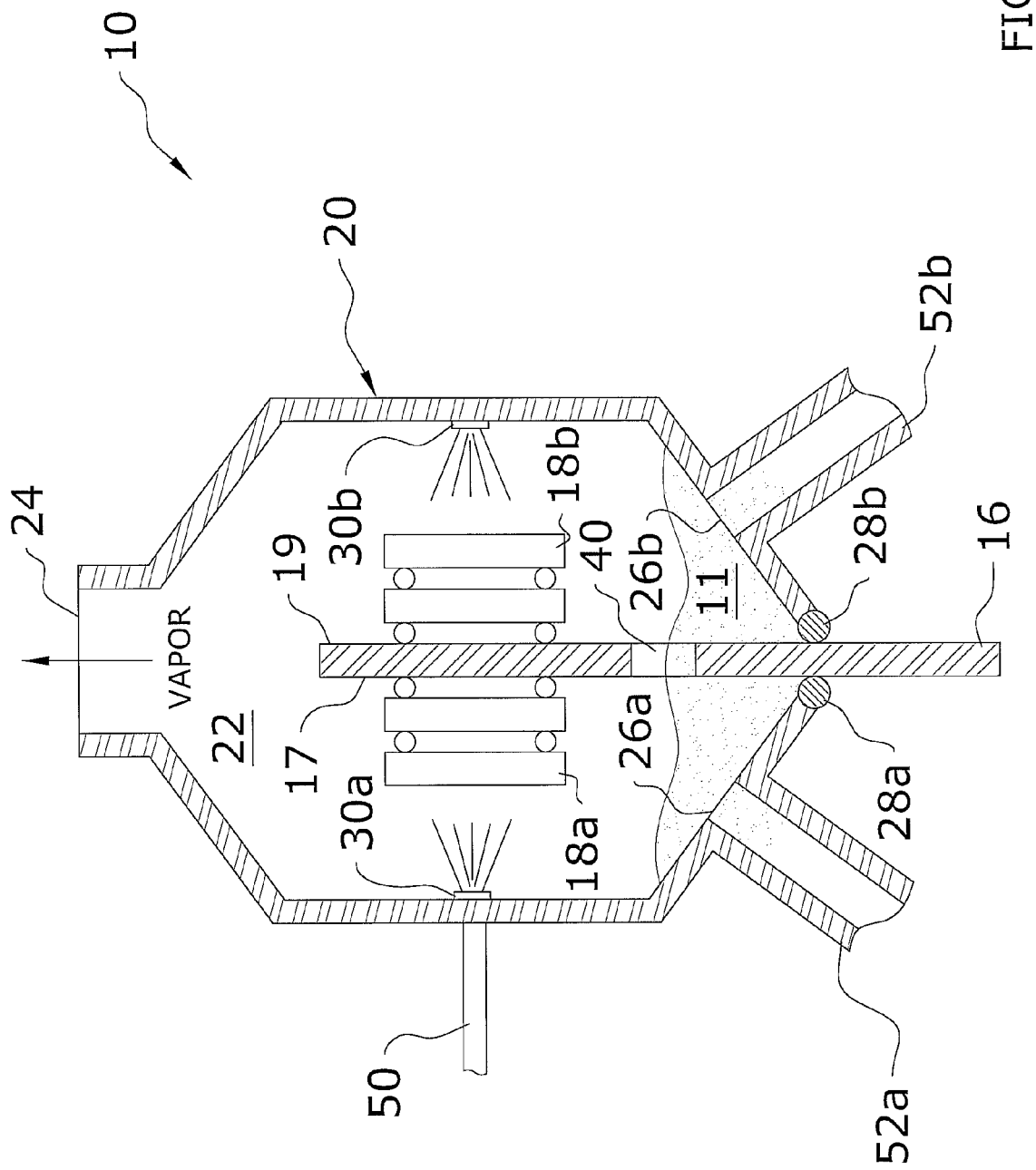
FIG. 2 is a side cutaway view of a second embodiment of the present invention.
Figure 3:
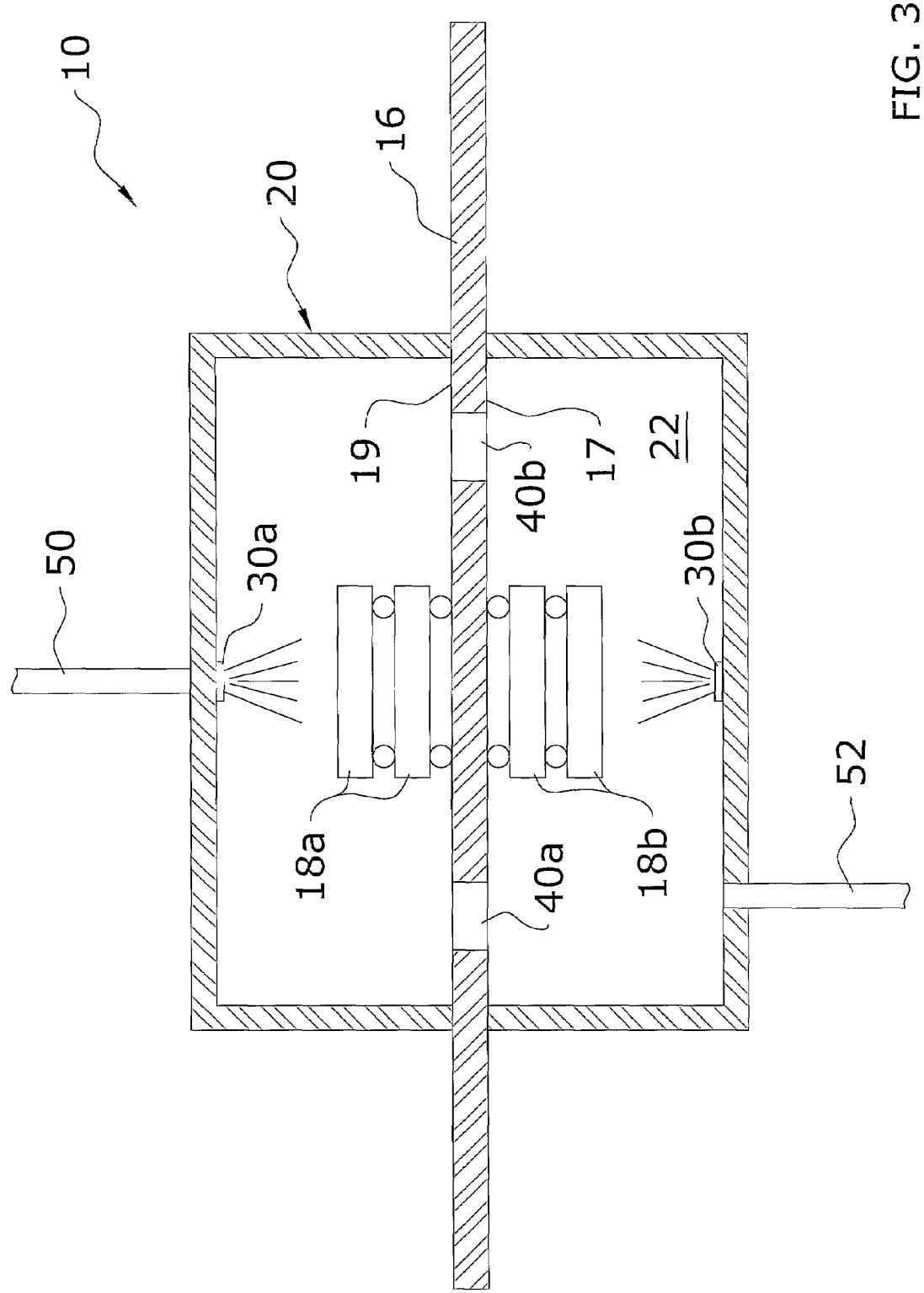
FIG. 3 is a side cutaway view of a third embodiment of the present invention.
Figure 4:
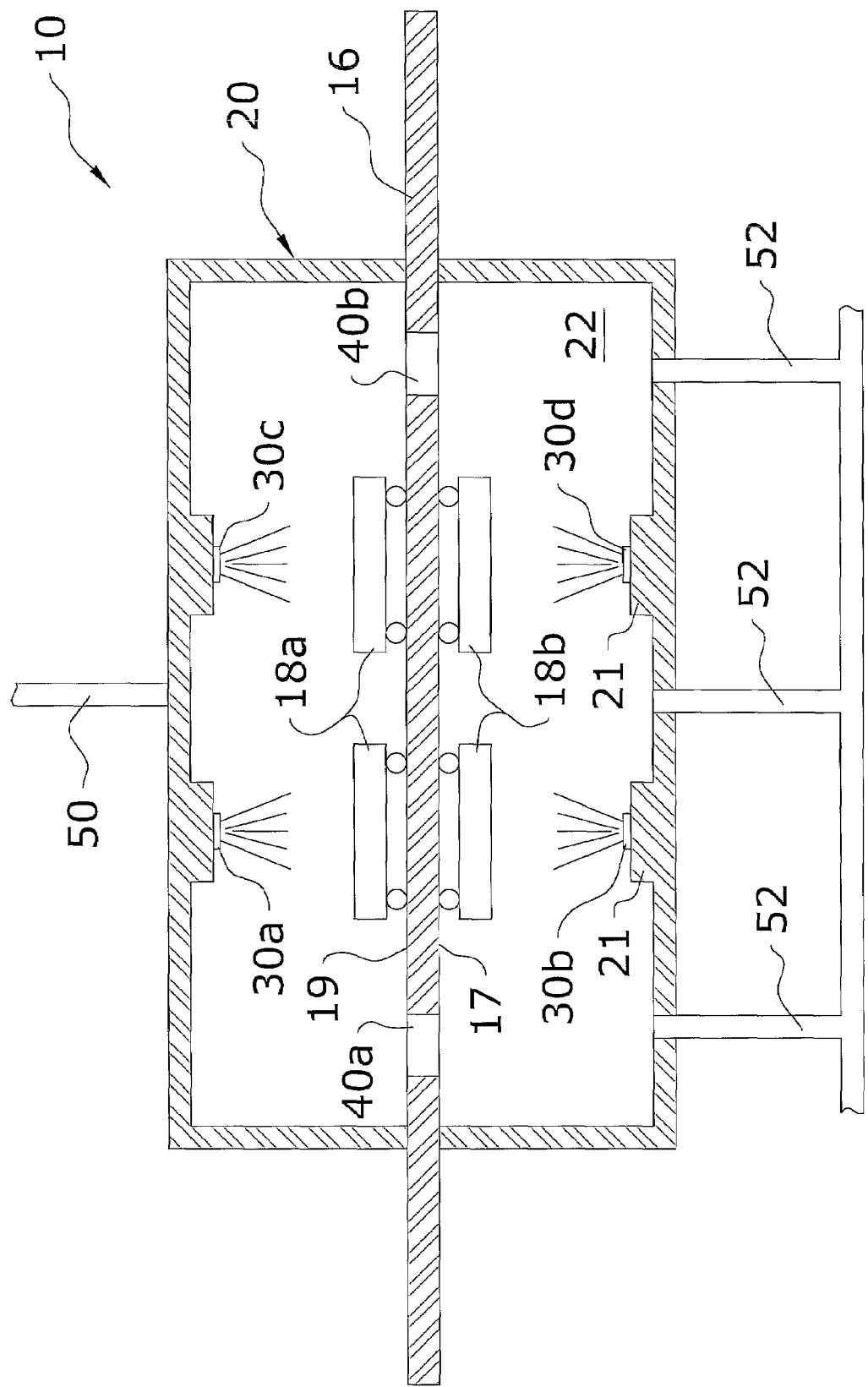
FIG. 4 is side cutaway view of a fourth embodiment of the present invention.

The printed circuit board 16 further includes a connecting end that electrically mates with a board connector 14 on a motherboard 12 as illustrated in FIG. 1 of the drawings. The printed circuit board 16 usually has an end opposite of the connecting end that may be positioned within the housing 20 (FIGS. 1 and 2) or external of the housing 20 (FIGS. 3 and 4).

C. Housing

FIGS. 1 through 4 illustrate the housing 20 attached to the printed circuit board 16. The housing 20 defines the interior 22 where at least a portion of the printed circuit board 16 is surrounded by the housing 20 and where the thermal management of electronic components 18a, 18b occurs. The housing 20 may be attached to the printed circuit board 16 from the factory or attached to the printed circuit board 16 by the user.

The housing 20 may be comprised of a unitary structure that has an opening to receive the printed circuit board 16 in a sealed manner. The housing 20 may also be comprised of two or more portions that are attached to one another and/or the printed circuit board 16 utilizing conventional fastening systems such as but not limited to threaded fasteners, adhesive, epoxy, solder and spring clips.

The housing 20 is preferably attached to the first side 17 and the second side 19 of the printed circuit board 16 as illustrated in FIGS. 1 through 4 of the drawings. The housing 20 is preferably sealed to the first side 17 and the second side 19 of the printed circuit board 16 by one or more seals 28. The seals 28 may be comprised of various devices such as but not limited to o-rings, gaskets, solder and glue. With the housing 20 sealed to the printed circuit board 16, liquid coolant 11 and vaporized coolant is prevented from escaping during the thermal management of the electronic components 18a, 18b on the printed circuit board 16.

The housing 20 surrounds a first portion of the first side 17 of the printed circuit board 16 and a second portion of the second side 19 of the printed circuit board 16 as further illustrated in FIGS. 1 through 4 of the drawings. The interior 22 of the housing 20 is at least partially separated into a first space and a second space by the printed circuit board 16. The first space is substantially defined by the first side 17 of the printed circuit board 16 and the housing 20, and the second space is substantially defined within the interior 22 by the second side 19 of the printed circuit board 16 and the housing 20 as further shown in FIGS. 1 through 4 of the drawings.

The first space and the second space of the interior 22 of the housing 20 are preferably fluidly connected to each other. In one embodiment illustrated in FIGS. 3 and 4 of the drawings, one or more apertures 40 preferably extend through the printed circuit board 16 to allow for the passage of the liquid coolant 11 and vaporized coolant. Another preferred embodiment is shown in FIGS. 1 and 2 where the distal end of the printed circuit board 16 does not pass through the housing 20 and allows a space for the coolant (liquid or vapor) to pass through thereby equalizing the first side 17 and the second side 19.

Figure 5:
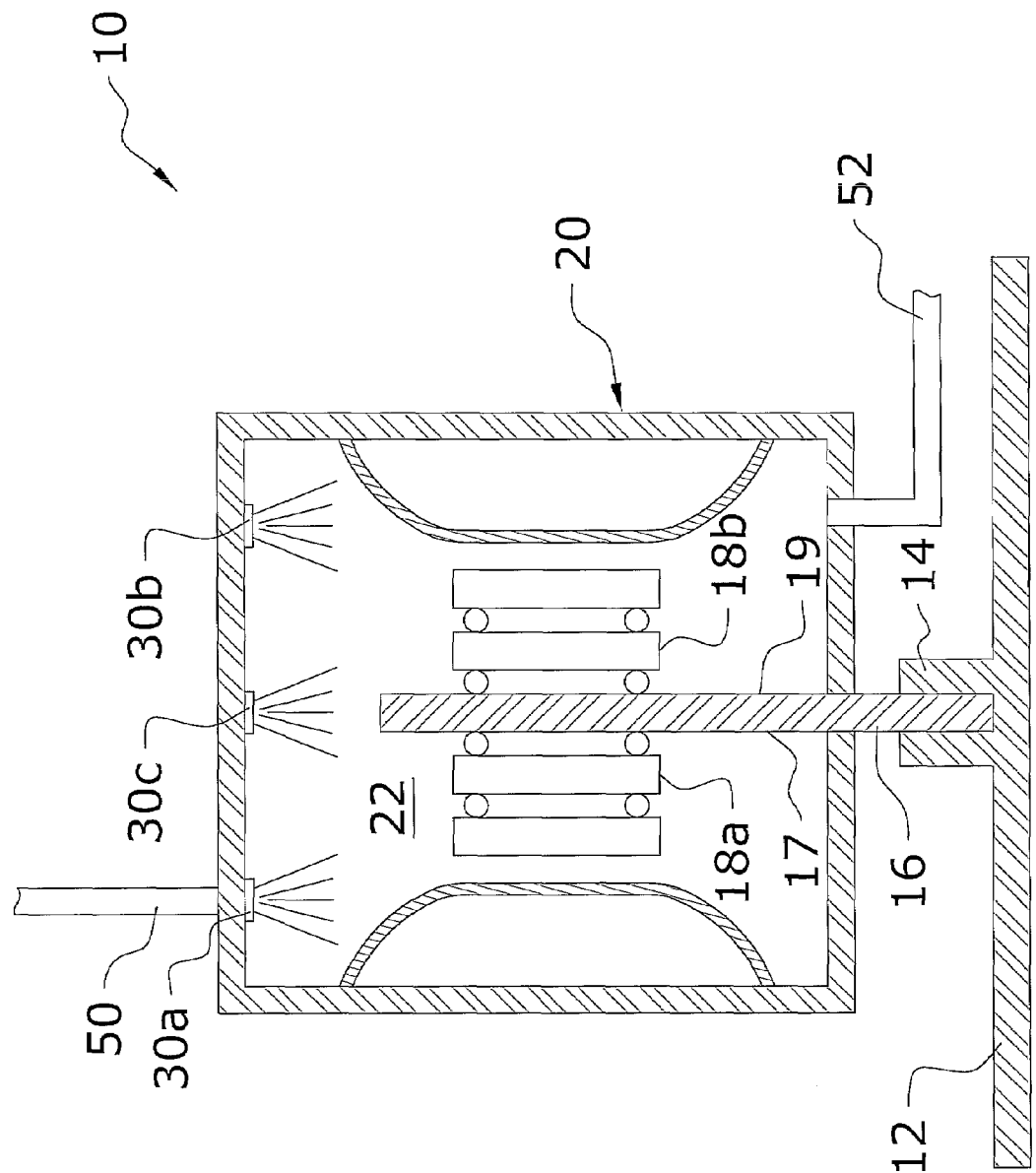
FIG. 5 is a side cutaway view of a fifth embodiment of the present invention.

In another embodiment illustrated in FIG. 5 of the drawings, the side walls of housing 20 may protrude inwardly forming a narrow gap with respect to the electronic components 18a, 18b being thermally managed, through which spray from the transverse direction flows. The narrow gap formed by the walls of the housing 20 is preferably approximately 0.020" to 0.125". U.S. Pat. Nos. 6,955,062 and 7,104,078 illustrate related liquid thermal management systems and are hereby incorporated by reference.

D. Coolant Dispensing Units

The housing 20 preferably includes one or more coolant dispensing units to dispense the liquid coolant 11 into the interior 22 of the housing 20 and upon the electronic components 18a, 18b to thermally manage the electronic components 18a, 18b. The coolant dispensing units may dispense the liquid coolant 11 directly upon the electronic components 18a, 18b or indirectly upon the electronic components 18a, 18b.

The coolant dispensing units may be comprised of single-phase liquid thermal management technologies such as but not limited to liquid cold plates. However, the coolant dispensing units preferably direct liquid coolant into direct contact with the electronic devices being thermally managed. Multi-phase liquid thermal management technologies such as but not limited to spray cooling, pool boiling, flow boiling, jet impingement cooling, falling-film cooling, parallel forced convection, curved channel cooling and capillary pumped loops are considered suitable for this invention.

The coolant dispensing units are preferably comprised of spray units 30a, and 30b, and/or 30c directed to spray atomized coolant at the printed circuit board 16 and the electronic components 18a, 18b attached to the printed circuit board 16 as illustrated in FIGS. 1 through 4 of the drawings. The spray units 30a, 30b, 30c are fluidly connected to a thermal conditioning unit that provides thermally conditioned liquid coolant 11 to the spray units 30a, 30b, 30c thereby efficiently thermally managing the printed circuit board 16 and its electronic components 18a, 18b.

U.S. Pat. No. 5,220,804 entitled High Heat Flux Evaporative Spray Cooling to Tilton et al. describes the earlier versions of spray technology, as it relates to cooling electronics and U.S. Pat. No. 6,108,201 entitled Fluid Control Apparatus and Method for Spray Cooling to Tilton et al. also describes the usage of spray technology to cool a circuit board which are hereby incorporated by reference.

As shown in FIGS. 1 through 5, a first spray unit 30a within the housing 20 is directed toward the first side 17 of the printed circuit board 16 to spray a liquid coolant 11 in a first direction upon the first electronic component 18a. As further shown in FIGS. 1 through 4, a second spray unit 30b within the housing 20 is directed toward the second side 19 of the printed circuit board 16 to spray a liquid coolant 11 in a second direction upon the second electronic component 18b. The second direction is preferably opposite of the first direction as further illustrated in the drawings. However, the second direction may be the same direction as the first direction such as a parallel flow along the sides 17, 19 of the printed circuit board 16 as illustrated in FIG. 5 of the drawings.

FIG. 1 illustrates using a third spray unit 30c within the housing 20 that is directed toward the distal end of the printed circuit board 16 to spray a liquid coolant 11 in a third direction upon the first electronic component 18a and the second electronic component 18b. The third direction of the spray from the third spray unit 30c is preferably substantially transverse with respect to the first direction and the second direction, and is not necessarily combined with 30a and 30b. It can be appreciated that one or more spray units 30a, 30b, or 30c may be implemented in the transverse direction to thermally manage components on each side. More than one spray unit 30a, 30b, or 30c may be positioned on each side of the printed circuit board 16 to provide increased thermal management of each side of the printed circuit board 16.

As shown in FIGS. 1 through 4 of the drawings, at least one supply line 50 is fluidly connected to the housing 20 to provide liquid coolant 11 to the spray units 30a, 30b, 30c and at least one return line 52 is fluidly connected to a lower portion of the housing 20 to return waste coolant back to the thermal conditioning unit. The supply line 50 is fluidly connected to any pressurized coolant source that provides pressurized coolant.

E. Alternative Embodiments in FIGS. 1 and 2

FIGS. 1 and 2 illustrate an embodiment where the printed circuit board 16 is in a substantially vertical state. As illustrated in FIGS. 1 and 2 of the drawings, the distal end of the printed circuit board 16 preferably does not extend to the opposing portion of the housing 20 and thereby defines an upper passage for coolant to pass through.

As shown in FIG. 2 of the drawings, a first return line 52a is fluidly connected to a lower portion of the housing 20 to receive liquid coolant 11 from the first space and a second return line 52b is fluidly connected to the lower portion of the housing 20 to receive liquid coolant 11 from the second space. The receiving of the liquid coolant 11 is preferably through gravity into the return lines 52.

An aperture 40 preferably extends within the printed circuit board 16 to allow coolant to flow through. The aperture 40 is preferably positioned within a lower portion of the printed circuit board 16 to allow liquid coolant 11 to flow between a lower portion of the first space and a lower portion of the second space.

As illustrated in FIG. 2, an upper opening 24 may be positioned within the housing 20 to allow coolant vapor to exit from the interior 22 of the housing 20. The upper opening 24 is preferably centered with respect to the printed circuit board 16, however the upper opening 24 may be positioned in various non-center locations.

F. Alternative Embodiments in FIGS. 3 and 4

FIGS. 3 and 4 illustrate embodiments wherein the printed circuit board 16 extends through the housing 20 thereby requiring sealing upon the printed circuit board 16 in at least two locations. FIGS. 3 and 4 further illustrate where the printed circuit board 16 is in a substantially horizontal state wherein the first space is in the lower portion of the interior 22 and the second space is in the upper portion of the interior 22 of the housing 20.

It is preferable that the printed circuit board 16 include at least one aperture 40 to allow fluid to pass between the first space and the second space within the housing 20 as further shown in FIGS. 3 and 4 of the drawings. It is preferable to utilize multiple apertures 40 positioned in opposite portions of the printed circuit board 16 to ensure reduced pooling of the liquid coolant 11 within the upper second space. For example, waste liquid coolant 11 in the upper second space would drain via gravity through the apertures 40 into the first space and then into the return line 52 for thermal conditioning.

In FIGS. 3 and 4, a spray unit 30b is positioned within a lower portion of the housing 20 (in the first space) and is preferably attached to a step 21 within the housing 20. The step 21 elevates the first spray unit above the flooded lower interior 22 surface of the housing 20 to avoid interference with the atomized coolant sprayed by the spray unit 30b.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A dual sided printed circuit board thermal management system, comprising:
   a printed circuit board having a first side and a second side, wherein said first side includes a first electronic component and wherein said second side includes a second electronic component;
   a housing attached to said printed circuit board defining an interior;
   wherein said housing surrounds a first portion of said first side of said printed circuit board and a second portion of said second side of said printed circuit board;
   wherein said interior of said housing is at least partially separated into a first space and a second space, wherein said first space is substantially defined by said first side of said printed circuit board and said housing, and wherein said second space is substantially defined within said interior by said second side of said printed circuit board and said housing;
   wherein said first space and said second space are fluidly connected to each other;
   a first coolant dispensing unit within said housing directed toward said first side of said printed circuit board to disperse a liquid coolant in a first direction upon said first electronic component; and a second coolant dispensing unit within said housing directed toward said second side of said printed circuit board to disperse a liquid coolant in a second direction upon said second electronic component;

wherein said printed circuit board extends through said housing and includes an aperture to allow fluid to pass between said first space and said second space.

2. The dual sided printed circuit board thermal management system of claim 1, wherein said first side and said second side of said printed circuit board are on opposite sides of said printed circuit board.

3. The dual sided printed circuit board thermal management system of claim 2, wherein said first side and said second side of said printed circuit board are substantially parallel to one another.

4. The dual sided printed circuit board thermal management system of claim 3, wherein said first direction is opposite of said second direction.

5. The dual sided printed circuit board thermal management system of claim 1, wherein said first coolant dispensing unit and said second coolant dispensing unit are comprised of spray units.

6. The dual sided printed circuit board thermal management system of claim 1, wherein said housing is sealed to said printed circuit board.

7. The dual sided printed circuit board thermal management system of claim 1, including a return line fluidly connected to a lower portion of said housing.

8. The dual sided printed circuit board thermal management system of claim 1, including a first return line fluidly connected to a lower portion of said housing to receive liquid coolant from said first space and a second return line fluidly connected to said lower portion of said housing to receive liquid coolant from said second space.

9. The dual sided printed circuit board thermal management system of claim 8, wherein said printed circuit board is in a substantially vertical state.

10. The dual sided printed circuit board thermal management system of claim 9, including an aperture within said printed circuit board, wherein said aperture is positioned within said printed circuit board to allow liquid coolant to flow between a lower portion of said first space and a lower portion of said second space.

11. The dual sided printed circuit board thermal management system of claim 8, including an upper opening within said housing to allow coolant vapor to exit from said interior.

12. The dual sided printed circuit board thermal management system of claim 1, wherein said first coolant dispensing unit is positioned within a lower portion of said housing and wherein said first coolant dispensing unit is attached to a step within said housing to disperse liquid coolant from a point above a liquid coolant level within said first space.

13. The dual sided printed circuit board thermal management system of claim 12, wherein said printed circuit board is in a substantially horizontal state.

14. The dual sided printed circuit board thermal management system of claim 1, wherein said housing is attached to said first side and said second side of said printed circuit board.

15. The dual sided printed circuit board thermal management system of claim 1, including a seal between said housing and said printed circuit board.

16. A dual sided printed circuit board thermal management system, comprising:

a printed circuit board having a first side and a second side, wherein said first side includes a first electronic component and wherein said second side includes a second electronic component;

wherein said first side and said second side of said printed circuit board are on opposite sides of said printed circuit board;

wherein said first side and said second side of said printed circuit board are substantially parallel to one another;

a housing attached to said printed circuit board defining an interior;

wherein said housing is attached to said first side and said second side of said printed circuit board;

wherein said housing surrounds a first portion of said first side of said printed circuit board and a second portion of said second side of said printed circuit board;

wherein said interior of said housing is at least partially separated into a first space and a second space, wherein said first space is substantially defined by said first side of said printed circuit board and said housing, and wherein said second space is substantially defined within said interior by said second side of said printed circuit board and said housing;

wherein said first space and said second space are fluidly connected to each other;

a first coolant dispensing unit within said housing directed toward said first side of said printed circuit board to disperse a liquid coolant in a first direction upon said first electronic component;

a second coolant dispensing unit within said housing directed toward said second side of said printed circuit board to disperse a liquid coolant in a second direction upon said second electronic component, wherein said second direction is opposite of said first direction;

at least one return line fluidly connected to a lower portion of said housing;

wherein said printed circuit board extends through said housing and includes an aperture to allow fluid to pass between said first space and said second space.

17. The dual sided printed circuit board thermal management system of claim 16, wherein said first coolant dispensing unit and said second coolant dispensing unit are comprised of spray units.

18. The dual sided printed circuit board thermal management system of claim 16, wherein said at least one return line is comprised of a first return line fluidly connected to a lower portion of said housing to receive liquid coolant from said first space and a second return line fluidly connected to said lower portion of said housing to receive liquid coolant from said second space.

19. The dual sided printed circuit board thermal management system of claim 18, wherein said printed circuit board is in a substantially vertical state.

20. The dual sided printed circuit board thermal management system of claim 19, including an aperture within said printed circuit board, wherein said aperture is positioned within said printed circuit board to allow liquid coolant to flow between a lower portion of said first space and a lower portion of said second space.

21. The dual sided printed circuit board thermal management system of claim 16, including an upper opening within said housing to allow coolant vapor to exit from said interior.

22. The dual sided printed circuit board thermal management system of claim 16, wherein said first coolant dispensing unit is positioned within a lower portion of said housing and wherein said first coolant dispensing unit is attached to a step within said housing to disperse liquid coolant from a point above a liquid coolant level within said first space.

23. The dual sided printed circuit board thermal management system of claim 22, wherein said printed circuit board is in a substantially horizontal state.

24. A dual sided printed circuit board thermal management system, comprising:
- a printed circuit board having a first side and a second side, wherein said first side includes a first electronic component and wherein said second side includes a second electronic component;
- a housing attached to said printed circuit board defining an interior;
- wherein said housing surrounds a first portion of said first side of said printed circuit board and a second portion of said second side of said printed circuit board;
- wherein said interior of said housing is at least partially separated into a first space and a second space, wherein said first space is substantially defined by said first side of said printed circuit board and said housing, and wherein said second space is substantially defined within said interior by said second side of said printed circuit board and said housing;
- wherein said first space and said second space are fluidly connected to each other;
- a first coolant dispensing unit within said housing directed toward said first side of said printed circuit board to disperse a liquid coolant in a first direction upon said first electronic component; and
- a second coolant dispensing unit within said housing directed toward said second side of said printed circuit board to disperse a liquid coolant in a second direction upon said second electronic component;
- wherein said first coolant dispensing unit is positioned within a lower portion of said housing and wherein said first coolant dispensing unit is attached to a step within said housing to disperse liquid coolant from a point above a liquid coolant level within said first space.

* * * * *